US012674840B2

(12) United States Patent
Hao et al.

(10) Patent No.: US 12,674,840 B2
(45) Date of Patent: Jul. 7, 2026

(54) METHOD, SYSTEM AND STORAGE MEDIUM FOR SOLID-PHASE CONCENTRATION CORRECTION OF LITHIUM BATTERIES

(71) Applicant: Makesense Energy Technology Co., Limited., Shanghai (CN)

(72) Inventors: Pingchao Hao, Shanghai (CN); Zhiyi Zhang, Shanghai (CN); Yanan Guo, Shanghai (CN); Xiao Yan, Shanghai (CN); Enhai Zhao, Shanghai (CN); Zhou Yang, Shanghai (CN); Zhimin Zhou, Shanghai (CN); Xiaohua Chen, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 381 days.

(21) Appl. No.: 18/208,372

(22) Filed: Jun. 12, 2023

(65) Prior Publication Data

US 2023/0417834 A1 Dec. 28, 2023

(30) Foreign Application Priority Data

Jun. 28, 2022 (CN) .......................... 202210741901.0

(51) Int. Cl.
*G01R 31/367* (2019.01)
*G01R 31/388* (2019.01)
(52) U.S. Cl.
CPC ......... *G01R 31/367* (2019.01); *G01R 31/388* (2019.01)

(58) Field of Classification Search
CPC . G01R 31/367; G01R 31/388; G01R 31/3842
See application file for complete search history.

(56) References Cited

U.S. PATENT DOCUMENTS

2023/0280404 A1* 9/2023 Hao ................... G01R 31/3842
702/63

* cited by examiner

*Primary Examiner* — Lam S Nguyen
(74) *Attorney, Agent, or Firm* — troutman pepper locke; Tim Tingkang Xia, Esq.

(57) ABSTRACT

The invention discloses a method, a system and a storage medium for solid-phase concentration correction of a lithium battery. The method includes establishing an electrochemical model of the lithium battery; initializing a solid phase concentration in the electrochemical model to be a first solid phase concentration; simulating the simulated output voltage of the lithium battery in a preset period according to the electrochemical model, the preset current and the first solid-phase concentration; acquiring the actual output voltage of the lithium battery in the preset period; calculating an error coefficient between the simulation output voltage and the actual output voltage, and presetting an error threshold corresponding to the error coefficient; and when the error coefficient is greater than the error threshold, performing iterative correction on the first solid phase concentration until the error coefficient is not greater than the error threshold, and outputting the corrected second solid phase concentration.

9 Claims, 9 Drawing Sheets

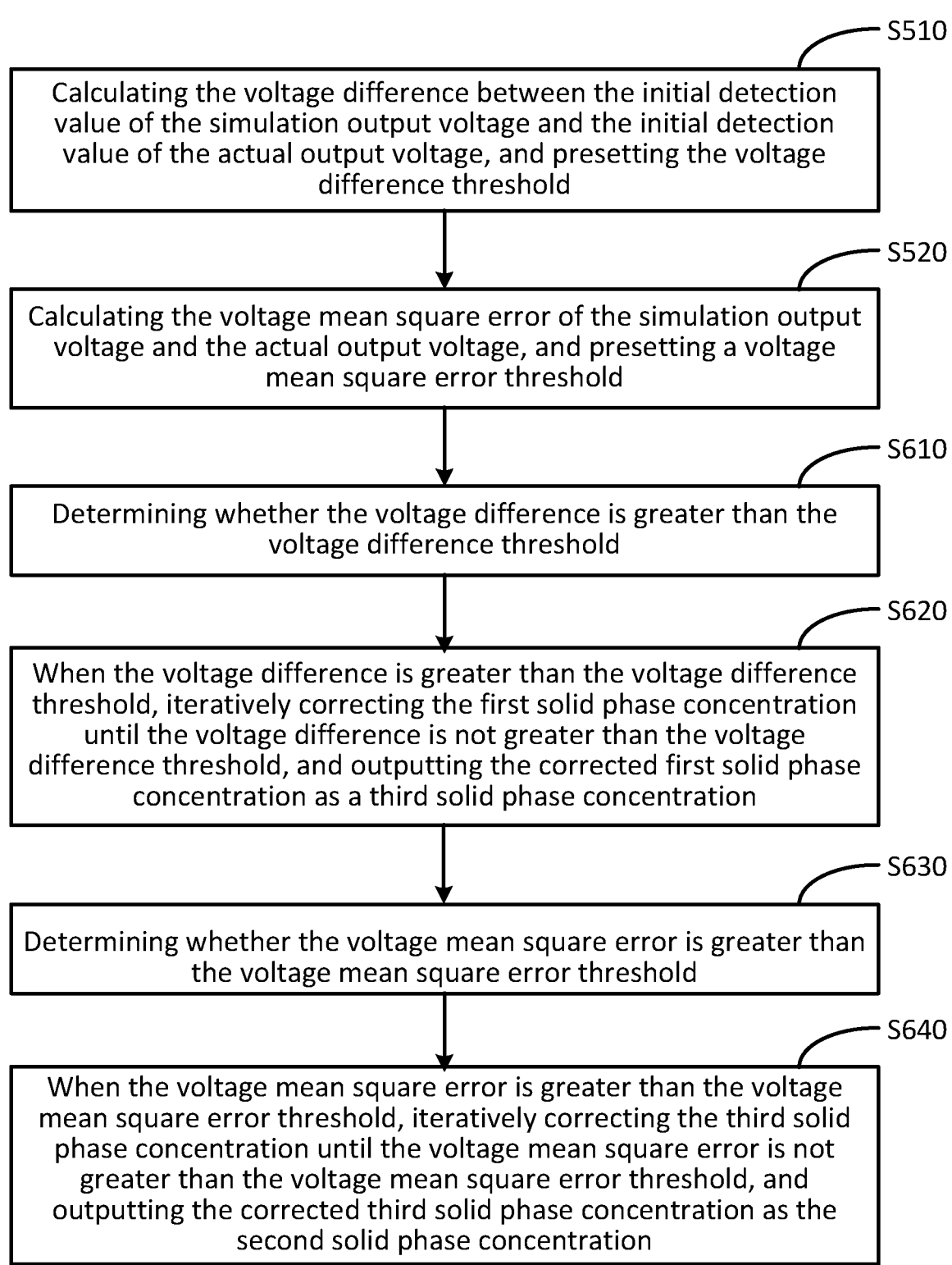

S510

Calculating the voltage difference between the initial detection value of the simulation output voltage and the initial detection value of the actual output voltage, and presetting the voltage difference threshold

S520

Calculating the voltage mean square error of the simulation output voltage and the actual output voltage, and presetting a voltage mean square error threshold

S610

Determining whether the voltage difference is greater than the voltage difference threshold

S620

When the voltage difference is greater than the voltage difference threshold, iteratively correcting the first solid phase concentration until the voltage difference is not greater than the voltage difference threshold, and outputting the corrected first solid phase concentration as a third solid phase concentration

S630

Determining whether the voltage mean square error is greater than the voltage mean square error threshold

S640

When the voltage mean square error is greater than the voltage mean square error threshold, iteratively correcting the third solid phase concentration until the voltage mean square error is not greater than the voltage mean square error threshold, and outputting the corrected third solid phase concentration as the second solid phase concentration

FIG. 5

METHOD, SYSTEM AND STORAGE MEDIUM FOR SOLID-PHASE CONCENTRATION CORRECTION OF LITHIUM BATTERIES

CROSS-REFERENCE TO RELATED PATENT APPLICATION

This application claims priority to and the benefit of Chinese Patent Application No. 202210741901.0, filed Jun. 28, 2022, which are incorporated herein in their entireties by reference.

FIELD OF THE INVENTION

The invention relates generally the field of batteries, and more particularly to a method, a system and a storage medium for correcting solid-phase concentration of a lithium battery.

BACKGROUND OF THE INVENTION

At present, a large number of lithium batteries are usually used in an energy storage power station. The estimation of internal performance parameters of the batteries is not only an important function of a battery management system (BMS), but also an important parameter of the performance of the energy storage power station. The accurate estimation of the internal performance parameters of the batteries can significantly improve the performance of the batteries, and maximize the adjustment effect and economic value of the power station in frequency modulation energy storage and "peak shaving and valley filling".

Among the internal performance parameters of the battery, the solid phase concentration is used as a plurality of internal performance parameters which can directly or indirectly influence the battery. The solid phase concentration of the battery is usually predicted by the electrochemical formula, or obtained by the user consulting the relevant material parameters. These methods usually have certain errors in determination of the solid phase concentration, which affect the subsequent calculation of battery performance.

Therefore, there is a need for a method for correcting the solid phase concentration of lithium batteries, which can correct the solid phase concentration of lithium batteries, improve the accuracy of calculation of the solid phase concentration of lithium batteries, and facilitate accurate calculation of other parameters of lithium batteries according to the solid phase concentration of lithium batteries.

SUMMARY OF THE INVENTION

In view of the above-noted shortcomings, one of the objectives of this invention is to provide a method, a system and a storage medium for correcting the solid-phase concentration of the lithium battery to solve the technical problems in calculation of the solid-phase concentration of the lithium battery in the prior art.

In one aspect of the invention, the method for solid phase concentration correction of the lithium battery comprises establishing an electrochemical model of the lithium battery; initializing a solid phase concentration in the electrochemical model to be a first solid phase concentration; simulating a simulated output voltage of the lithium battery in a preset period of time according to the electrochemical model, a preset current and the first solid-phase concentration; acquiring an actual output voltage of the lithium battery in the preset period of time; calculating an error coefficient between the simulation output voltage and the actual output voltage, and presetting an error threshold corresponding to the error coefficient, wherein the error coefficient comprises a voltage difference and a voltage mean square error of an initial detection value; and when the error coefficient is greater than the error threshold, performing an iterative correction on the first solid phase concentration until the error coefficient is not greater than the error threshold, and outputting the corrected first solid phase concentration as a second solid phase concentration.

According to embodiments of the method for correcting the solid phase concentration of a lithium battery of the invention, the iterative correction on the preset first solid phase concentration is performed by comparing the difference between the simulated output voltage of the electrochemical model and the actual output voltage of the lithium battery under preset working conditions, so as to obtain the accurate solid phase concentration value of the lithium battery, and the working condition parameters of the lithium battery can be conveniently and accurately obtained based on the solid-phase concentration.

In some embodiments, said calculating the error coefficient between the simulated output voltage and the actual output voltage and said presetting the error threshold corresponding to the error coefficient comprises calculating the voltage difference between the initial detection value of the simulation output voltage and the initial detection value of the actual output voltage, and presetting the voltage difference threshold.

According to embodiments of the method for correcting the solid phase concentration of the lithium battery of the invention, the solid phase concentration of the lithium battery is iteratively corrected by determining whether the voltage difference between the initial detection value of the simulated output voltage and the initial detection value of the actual output voltage is not greater than the preset voltage threshold, so as to obtain the accurate solid phase concentration value of the lithium battery.

In some embodiments, said calculating the error coefficient between the simulated output voltage and the actual output voltage and said presetting the error threshold corresponding to the error coefficient further comprises calculating the voltage mean square error of the simulation output voltage and the actual output voltage, and presetting a voltage mean square error threshold.

When the error coefficient is greater than the error threshold, said performing the iterative correction on the first solid phase concentration until the error coefficient is not greater than the error threshold and said outputting the corrected first solid phase concentration as the second solid phase concentration, comprise determining whether the voltage difference is greater than the voltage difference threshold;

when the voltage difference is greater than the voltage difference threshold, iteratively correcting the first solid phase concentration until the voltage difference is not greater than the voltage difference threshold, and outputting the corrected first solid phase concentration as a third solid phase concentration;

determining whether the voltage mean square error is greater than the voltage mean square error threshold; and when the voltage mean square error is greater than the voltage mean square error threshold, iteratively correcting the third solid phase concentration until the voltage mean square error is not greater than the voltage mean square error threshold, and outputting the corrected third solid phase concentration as the second solid phase concentration.

According to embodiments of the method for correcting the solid phase concentration of the lithium battery of the invention, on the basis of determining whether the voltage difference between the initial detection value of the simulated output voltage and the initial detection value of the actual output voltage is not greater than the preset voltage threshold, the solid-phase concentration value of the lithium battery is corrected more accurately in an iterative manner by secondarily determining whether the voltage mean square error is greater than the preset voltage mean square error threshold. The iterative correction precision is controlled by adjusting the voltage difference threshold and the voltage mean square error threshold.

In some embodiments, the iterative correction of the first solid phase concentration comprises iteratively correcting a positive electrode solid phase concentration in the first solid phase concentration using a gradient descent method, according to a formula of:

$$c = c - lr \times \Delta V \times \frac{dc}{docp}$$

wherein c is the positive electrode solid phase concentration in the first solid phase concentration, lr is the correction coefficient, $\Delta V$ is the voltage difference, ocp is an open circuit potential of the electrode when the solid phase concentration of the positive electrode is c; and correcting a negative electrode solid-phase concentration in the first solid-phase concentration according to the corrected positive electrode solid-phase concentration.

According to embodiments of the method for correcting the solid phase concentration of the lithium battery of the invention, the solid phase concentration value of the lithium battery is iteratively corrected through the gradient descent method. The speed and accuracy of the iterative correction can be adjusted according to the adjustment of the correction coefficient.

In some embodiments, prior to said iteratively correcting the positive electrode solid phase concentration in the first solid phase concentration using the gradient descent method, the method further comprises acquiring a first corresponding relation between a lithium battery electrode material ocp, an lithium ion concentration c, and a dc/docp value of the lithium battery, wherein ocp is the open-circuit potential of the electrode when its lithium ion concentration is c; and obtaining a second corresponding relation of dc/docp and ocp according to the first corresponding relation and the dc/docp value of the lithium battery.

In some embodiments, said acquiring the actual output voltage of the lithium battery in the preset period of time comprises acquiring the actual output voltage of the lithium battery in the preset period of time at preset intervals.

According to embodiments of the method for correcting the solid phase concentration of the lithium battery of the invention, by conducting charging and discharging experiments within a period of time at regular intervals, the solid phase concentration can be corrected according to the data of the charging and discharging experiments.

In some embodiments, said acquiring the actual output voltage of the lithium battery in the preset period of time further comprises acquiring the actual output voltage of the lithium battery in the preset period of time in real time.

According to embodiments of the method for correcting the solid phase concentration of the lithium battery of the invention, by collecting the charging and discharging data of the lithium battery in real time, the solid phase concentration can be corrected according to the collected charging and discharging data.

In some embodiments, after outputting the second solid phase concentration, the method further comprises calculating a SOC value of the lithium battery according to the second solid phase concentration.

According to embodiments of the method for correcting the solid phase concentration of the lithium battery of the invention, the SOC value of the lithium battery can be calculated according to the corrected solid phase concentration value, and the accuracy of the calculation of the SOC value of the lithium battery can be improved, which can avoid errors in the calculation of the SOC value of the lithium battery in the prior art that affects the control of the battery pack.

In another aspect of the invention, the system for solid phase concentration correction of a lithium battery comprise:

a model setting module configured to establish a electrochemical model of the lithium battery;

a solid phase concentration initializing module configured to initialize a solid phase concentration in the electrochemical model to be a first solid phase concentration;

a simulation module respectively connected with the model setting module and the solid-phase concentration initializing module, and configured to simulate a simulated output voltage of the lithium battery in a preset period of time according to the electrochemical model, a preset current and the first solid-phase concentration;

an acquisition module configured to acquire an actual output voltage of the lithium battery in the preset period of time;

a calculation module respectively connected with the simulation module and the acquisition module and configured to calculate an error coefficient between the simulation output voltage and the actual output voltage, and preset an error threshold corresponding to the error coefficient, wherein the error coefficient comprises a voltage difference and a voltage mean square error of an initial detection value; and a correction module connected with the calculation module and configured to, when the error coefficient is greater than the error threshold, perform an iterative correction on the first solid phase concentration until the error coefficient is not greater than the error threshold, and output the corrected first solid phase concentration as a second solid phase concentration.

In yet another aspect of the invention, the non-transitory tangible computer-readable medium storing at least one instruction which, when executed by one or more processors, carries out the method for solid phase concentration correction of a lithium battery as disclosed above.

The invention discloses a method, a system and a storage medium for solid-phase concentration correction of a lithium battery, which have at least one of the following technical effects.

(1) By comparing the difference between the simulated output voltage of the electrochemical model and the actual output voltage of the lithium battery under preset working conditions, the iterative correction on the preset first solid phase concentration is performed, so as to obtain the accurate solid phase concentration value of the lithium battery, and the working condition parameters of the lithium battery can be conveniently and accurately obtained based on the solid-phase concentration.

(2) By determining whether the voltage difference between the initial detection value of the simulated output voltage and the initial detection value of the actual output voltage is not greater than the preset voltage threshold, the solid phase concentration of the lithium battery is iteratively corrected so as to obtain the accurate solid phase concentration value of the lithium battery.

(3) on the basis of determining whether the voltage difference between the initial detection value of the simulated output voltage and the initial detection value of the actual output voltage is not greater than the preset voltage threshold, the solid-phase concentration value of the lithium battery is corrected more accurately in an iterative manner by secondarily determining whether the voltage mean square error is greater than the preset voltage mean square error threshold, wherein the iterative correction precision is controlled by adjusting the voltage difference threshold and the voltage mean square error threshold.

(4) The solid phase concentration value of the lithium battery is iteratively corrected through the gradient descent method. The speed and accuracy of the iterative correction can be adjusted according to the adjustment of the correction coefficient.

(5) By conducting charging and discharging experiments within a period of time at regular intervals, the solid phase concentration can be corrected according to the data of the charging and discharging experiments. Further, by collecting the charging and discharging data of the lithium battery in real time, the solid phase concentration can be corrected according to the collected charging and discharging data.

(6) The SOC value of the lithium battery can be calculated according to the corrected solid phase concentration value, and the accuracy of the calculation of the SOC value of the lithium battery can be improved, which can avoid errors in the calculation of the SOC value of the lithium battery in the prior art that affects the control of the battery pack.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

FIG. 5 shows schematically another flowchart of calculating an error coefficient between a simulated output voltage and an actual output voltage according to one embodiment of the method for correcting the solid phase concentration of the lithium battery of the invention.

DETAILED DESCRIPTION OF THE INVENTION

Figure 1:
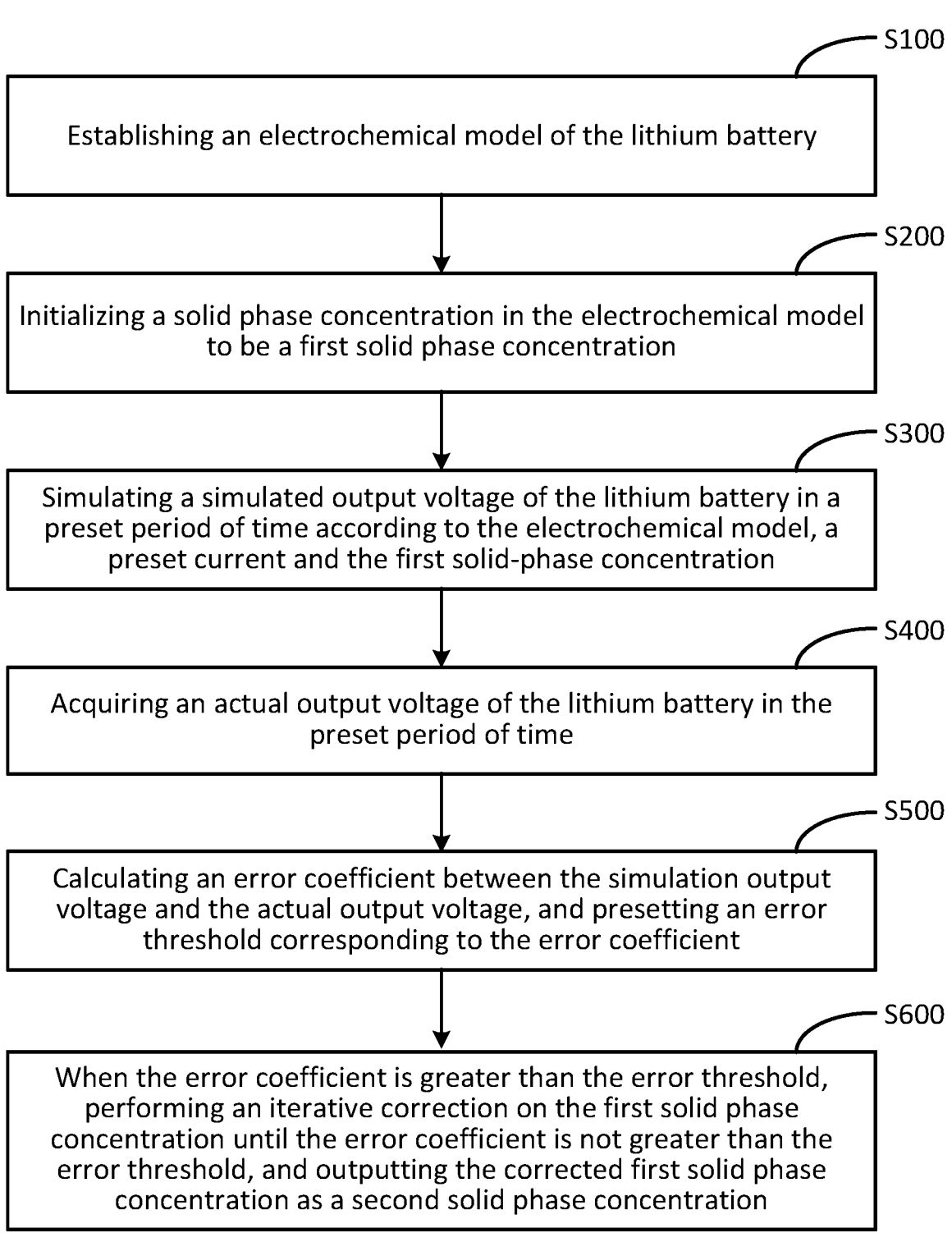
FIG. 1 shows schematically a flowchart of a method for correcting a solid phase concentration of a lithium battery according to embodiments of the invention.

In the following description, for purposes of explanation and not limitation, specific details are set forth, such as particular system configurations, techniques, etc. in order to provide a thorough understanding of the embodiments of the invention. However, it will be apparent to one skilled in the art that the invention may be practiced in other embodiments that depart from these specific details. In other instances, detailed descriptions of well-known systems, devices, circuits, and methods are omitted so as not to obscure the description of the invention with unnecessary detail.

It should be understood that the terms "comprises" and/or "comprising", or "includes" and/or "including", or "has" and/or "having", or "carry" and/or "carrying", or "contain" and/or "containing", or "characterized by", and the like are to be open-ended, i.e., to mean including but not limited to. When used in this disclosure, they specify the presence of stated features, regions, integers, steps, operations, elements, and/or components, but do not preclude the presence or addition of one or more other features, regions, integers, steps, operations, elements, components, and/or groups thereof.

It should be noted that the drawings provided in the following embodiments are merely illustrative in nature and serve to explain the principles of the invention, and are in no way intended to limit the invention, its application, or uses. Only the components related to the invention are shown in the drawings rather than the number, shape and size of the components in actual implementations. For components with the same structure or function in some figures, only one of them is schematically shown, or only one of them is marked. They do not represent the actual structure of the product. Dimensional drawing, the type, quantity and proportion of each component can be changed arbitrarily in its actual implementations. More complicate component layouts may also become apparent in view of the drawings, the specification, and the following claims.

It should be understood that, as used in the description herein and throughout the claims that follow, the meaning of "a", "an", and "the" includes plural reference unless the context clearly dictates otherwise. The term "and/or" as used in this specification and the appended claims refers to any and all possible combinations of one or more of the associated listed items, and includes such combinations.

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

In order to more clearly illustrate the embodiments of the invention or the technical solutions in the prior art, the following description will explain the specific embodiments of the invention with reference to the accompanying drawings. It is evident that the drawings in the following description are only examples of the invention, from which other drawings and other embodiments can be obtained by a person skilled in the art without inventive effort.

Figure 2:
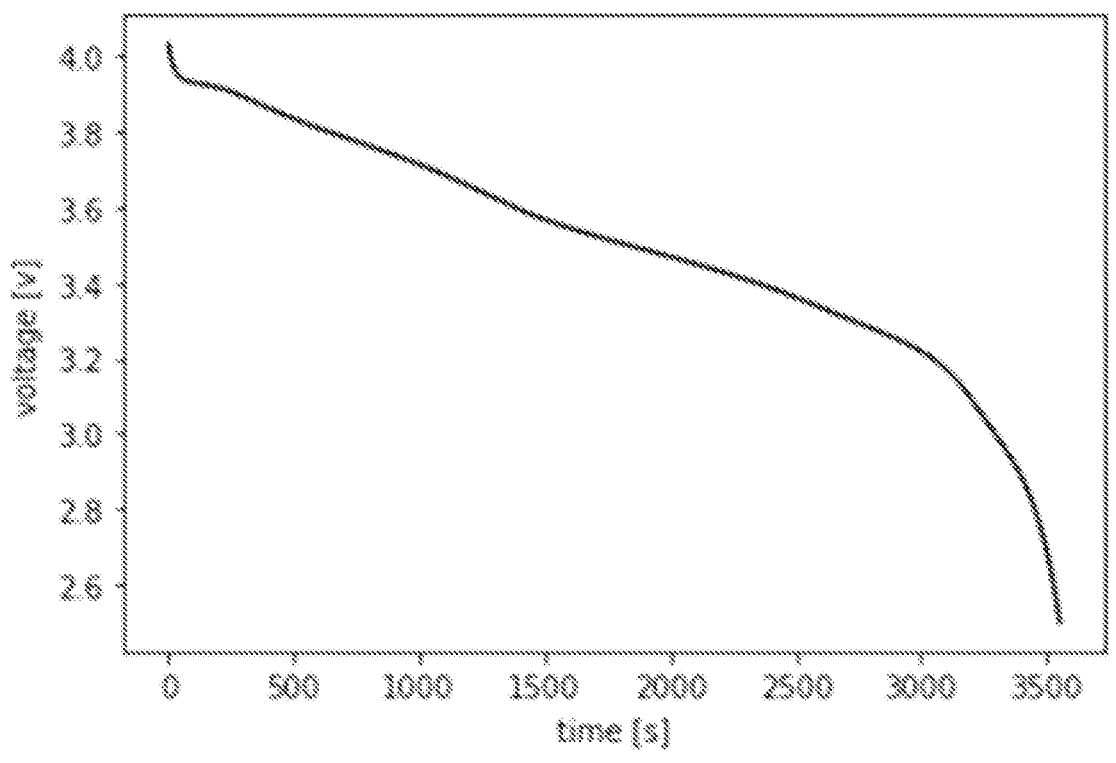
FIG. 2 shows schematically a curve of the voltage versus the operation time of a lithium battery in a 1C working condition obtained by electrochemical simulation according to one embodiment of the method for correcting the solid phase concentration of the lithium battery of the invention.
Figure 3:
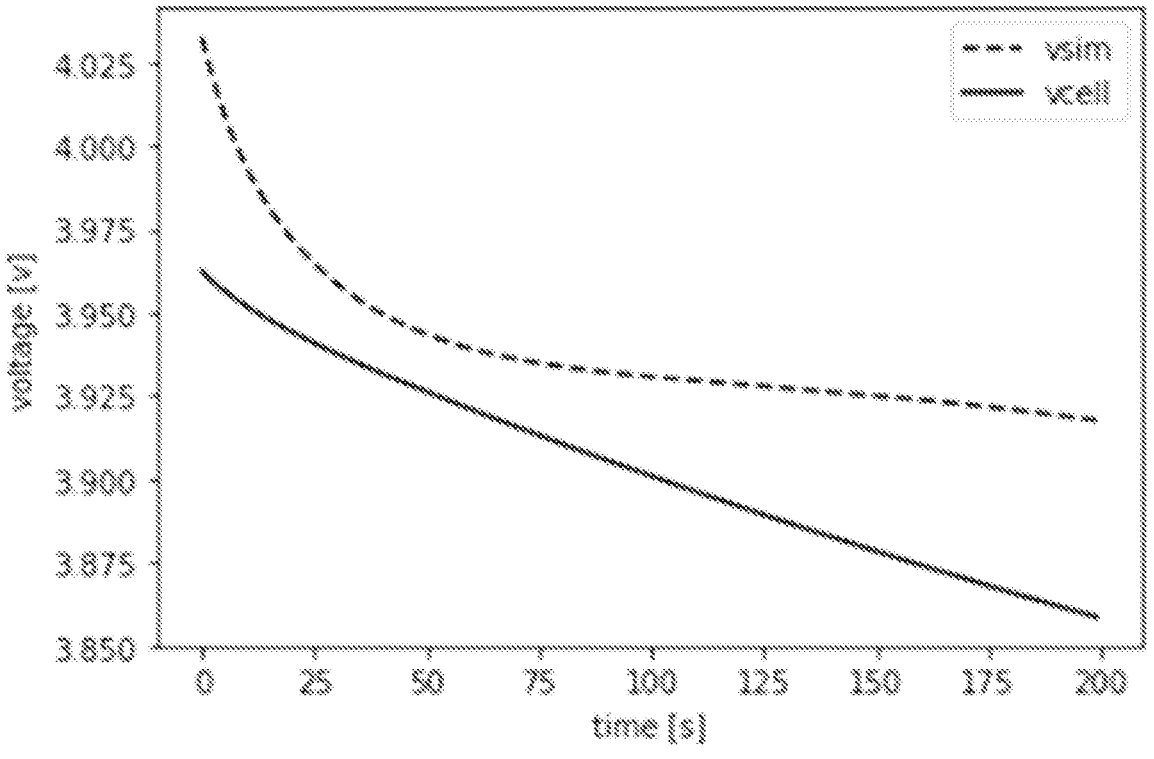
FIG. 3 shows schematically a curve of the simulated output voltage versus the actual output voltage of the lithium battery when the positive solid concentration is $c_{p,100}$ under the working condition of 1C constant current discharge, simulated by the electrochemical model according to one embodiment of the method for correcting the solid phase concentration of the lithium battery of the invention.

As shown in FIGS. 1-3, a method for correcting solid phase concentration of a lithium battery is shown according to one embodiment of the invention. The methods includes the following steps.

At step S100, establishing an electrochemical model of the lithium battery.

Specifically, according to the battery parameters and environmental parameters of the lithium battery used in the actual working condition, the electrochemical model of the lithium battery can be established. The common electrochemical model structures, such as the P2D electrochemical model, the electrothermal coupling electrochemical model, etc., can be selected. The terminal voltage and lithium ion concentration distribution of lithium battery under different working conditions can be calculated through the established electrochemical model.

As an example, as shown in FIG. 2, which is a schematic diagram of voltage versus operating time of a lithium battery under a 1C operating condition based on electrochemical simulation, where 1C represents the current intensity when the battery is fully discharged for one hour.

At step S200, initializing a solid phase concentration in the electrochemical model to be a first solid phase concentration.

Specifically, in the process of initializing the solid phase concentration in the electrochemical model as the first solid phase concentration, the solid phase concentration can be set arbitrarily. When the state of charge of the battery is soc, the initial solid phase concentrations of the positive and negative electrodes satisfy the following formula:

$$\frac{c_{n,100} - c_{n,soc}}{c_{p,soc} - c_{p,100}} = \frac{L_p \varepsilon_p}{L_n \varepsilon_n};$$

wherein $c_{n,100}$ is a concentration of a negative electrode active material of the lithium battery at soc=100%, $c_{n,soc}$ is a concentration of the negative electrode active material of the lithium battery at soc, $L_n$ is a thickness of the negative electrode active material, $\varepsilon_n$ is a volume fraction of the negative electrode active material, and p represents a positive electrode active material of the lithium battery.

At step S300, simulating a simulated output voltage of the lithium battery in a preset period of time according to the electrochemical model, a preset current and the first solid-phase concentration.

Specifically, after the concentration is initialized, the preset current working condition is input into the electrochemical model, and the electrochemical model can simulate and output the simulated output voltage of the battery within a preset period of time.

At step S400, acquiring an actual output voltage of the lithium battery in the preset period of time.

In one exemplary embodiment shown in FIG. 3, which shows the simulated output voltage and the actual output voltage when the positive electrode solid phase concentration is $c_{p,100}$ under the condition of 1C constant current discharge of the lithium battery simulated by the electrochemical model, where $V_{sim}$ dashed line indicates the simulated output voltage curve, and $V_{cell}$ solid curve represents the actual output voltage curve.

At step S500, calculating an error coefficient between the simulation output voltage and the actual output voltage, and presetting an error threshold corresponding to the error coefficient.

Specifically, the error coefficient comprises a voltage difference and a voltage mean square error of an initial detection value. In the process of simulating the simulated output voltage of the lithium battery within the preset period of time and obtaining the actual output voltage of the lithium battery within the preset period of time, multiple sampling points are included, and $|V_{sim,1} - V_{real,1}|$ is set as the voltage difference of the initial detection value. $V_{sim,1}$ is the first voltage value output by the model simulation, and $V_{real,1}$ is the first voltage value of the battery measured under the working condition.

The voltage mean square error MSE is calculated according to the formula of:

$$MSE = \frac{1}{N}\sum_{i=1}^{N}(V_{sim,i} - V_{real,i})^2,$$

wherein $V_{sim,i}$ is an output voltage value of the model simulation at the ith sampling point, $V_{real,1}$ is the measured voltage value of the battery under the working condition of the ith sampling point, and N is the number of voltage data.

At step S600, when the error coefficient is greater than the error threshold, performing an iterative correction on the first solid phase concentration until the error coefficient is not greater than the error threshold, and outputting the corrected first solid phase concentration as a second solid phase concentration.

According to embodiments of the method for correcting the solid phase concentration of a lithium battery of the invention, the iterative correction on the preset first solid phase concentration is performed by comparing the difference between the simulated output voltage of the electrochemical model and the actual output voltage of the lithium battery under preset working conditions, so as to obtain the accurate solid phase concentration value of the lithium battery, and the working condition parameters of the lithium battery can be conveniently and accurately obtained based on the solid-phase concentration.

Figure 4:
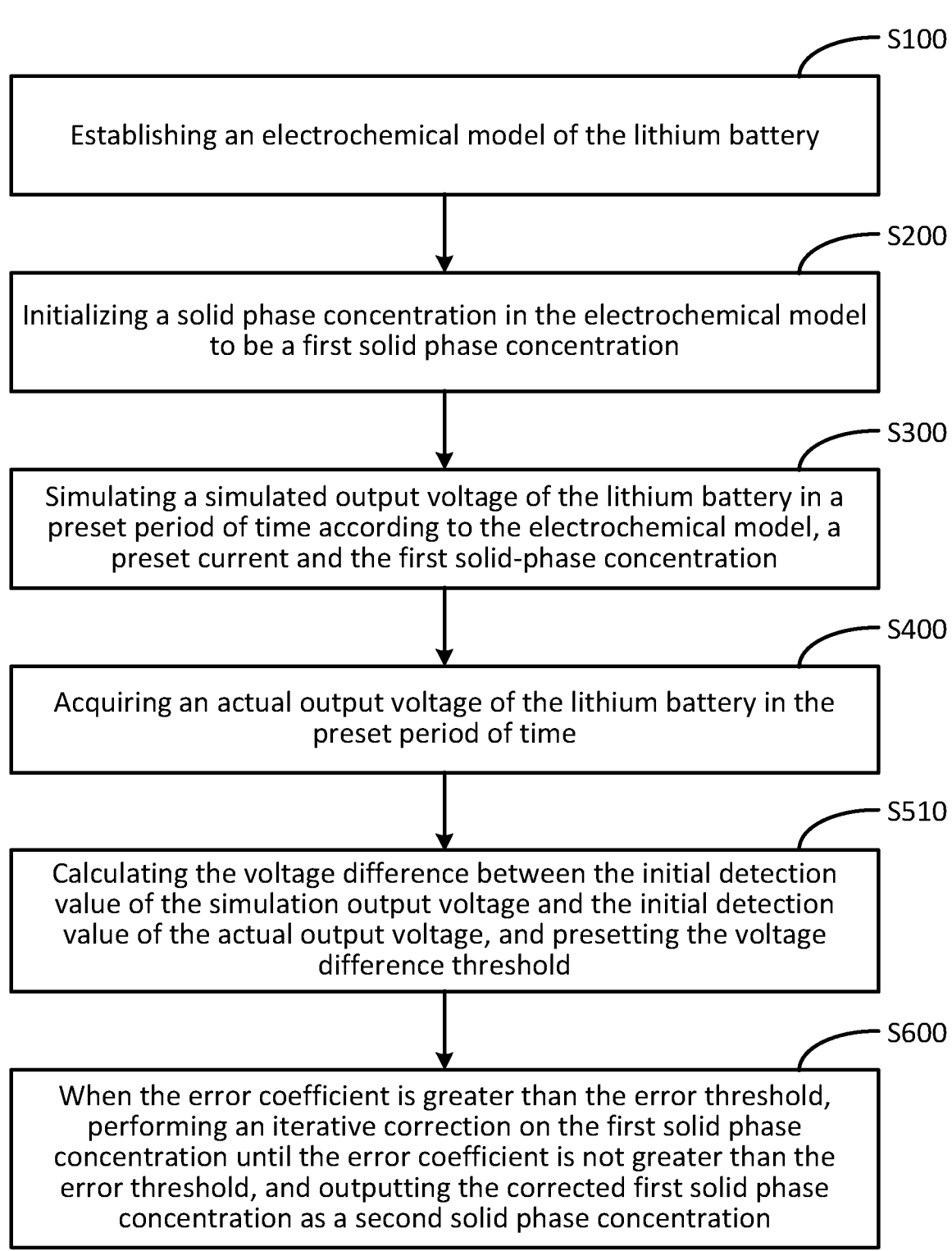
FIG. 4 shows schematically a flowchart of calculating an error coefficient between a simulated output voltage and an actual output voltage according to one embodiment of the method for correcting the solid phase concentration of the lithium battery of the invention.

In one embodiment, as shown in FIG. 4, said calculating an error coefficient between the simulation output voltage and the actual output voltage, and said presetting an error threshold corresponding to the error coefficient at step S500 include At step S510, calculating the voltage difference between the initial detection value of the simulation output voltage and the initial detection value of the actual output voltage, and presetting the voltage difference threshold.

Specifically, $|V_{sim,1}-V_{real,1}|$ is set as the voltage difference of the initial detection value. $V_{sim,1}$ is the first voltage value output by the model simulation, and $V_{real,1}$ is the first voltage value of the battery measured under the working condition. $V_{VT}$ is a voltage difference threshold. In the process of executing step S600, when $|V_{sim,1}-V_{real,1}|>V_{VT}$, iteratively correcting the first solid phase concentration until $|V_{sim,1}-V_{real,1}|\leq V_{VT}$, and outputting the corrected first solid phase concentration as a second solid phase concentration.

In one embodiment, as shown in FIG. 5, after the actual output voltage of the lithium battery in the preset period of time is acquired at step S400, the method further includes calculating the voltage difference between the initial detection value of the simulation output voltage and the initial detection value of the actual output voltage, and presetting the voltage difference threshold at step S510.

Specifically, $|V_{sim,1}-V_{real,1}|$ is the voltage difference of the initial detection value, where $V_{sim,1}$ is the first voltage value output by the model simulation, and $V_{real,1}$ is the first voltage value of the battery measured under the working condition. $V_{VT}$ is a voltage difference threshold. In the process of executing step S600, when $|V_{sim,1}-V_{real,1}|>V_{VT}$, iteratively correcting the first solid phase concentration until $|V_{sim,1}-V_{real,1}|\leq V_{VT}$, and outputting the corrected first solid phase concentration as a second solid phase concentration.

At step S520, calculating the voltage mean square error of the simulation output voltage and the actual output voltage, and presetting a voltage mean square error threshold.

The voltage mean square error MSE is calculated according to the formula of:

$$MSE = \frac{1}{N}\sum\nolimits_{i=1}^{N}(V_{sim,i} - V_{real,i})^2,$$

wherein $V_{sim,i}$ is an output voltage value of the model simulation at the ith sampling point, $V_{real,1}$ is the measured voltage value of the battery under the working condition of the ith sampling point, and N is the number of voltage data.

At step S610, determining whether the voltage difference is greater than the voltage difference threshold.

At step S620, when the voltage difference is greater than the voltage difference threshold, iteratively correcting the first solid phase concentration until the voltage difference is not greater than the voltage difference threshold, and outputting the corrected first solid phase concentration as a third solid phase concentration.

Specifically, the positive electrode solid phase concentration in the first solid phase concentration is iteratively corrected by the gradient descent method, according to a formula of:

$$c = c - lr \times \Delta V \times \frac{dc}{docp}$$

wherein c is the positive electrode solid phase concentration in the first solid phase concentration, lr is the correction coefficient, $\Delta V$ is the voltage difference, ocp is an open circuit potential of the electrode when the solid phase concentration of the positive electrode is c. The solid phase concentration value of the lithium battery is iteratively corrected by the gradient descent method, and the iterative correction speed and accuracy can be adjusted according to the adjustment of the correction coefficient.

Said correcting the negative electrode solid-phase concentration in the first solid-phase concentration based on the corrected positive electrode solid-phase concentration, according to the formula of:

$$\frac{c_{n,100} - c_{n,soc}}{c_{p,soc} - c_{p,100}} = \frac{L_p \varepsilon_p}{L_n \varepsilon_n};$$

wherein $c_{n,100}$ is a concentration of a negative electrode active material of the lithium battery at soc=100%, $c_{n,soc}$ is a concentration of the negative electrode active material of the lithium battery at soc, $L_n$ is a thickness of the negative electrode active material, $\varepsilon_n$ is a volume fraction of the negative electrode active material, and p represents a positive electrode active material of the lithium battery.

At step S630, determining whether the voltage mean square error is greater than the voltage mean square error threshold.

Specifically, the voltage mean square error MSE is calculated according to the formula of:

$$MSE = \frac{1}{N}\sum\nolimits_{i=1}^{N}(V_{sim,i} - V_{real,i})^2,$$

wherein $V_{sim,i}$ is an output voltage value of the model simulation at the ith sampling point, $V_{real,1}$ is the measured voltage value of the battery under the working condition of the ith sampling point, and N is the number of voltage data.

At step S640, when the voltage mean square error is greater than the voltage mean square error threshold, iteratively correcting the third solid phase concentration until the voltage mean square error is not greater than the voltage mean square error threshold, and outputting the corrected third solid phase concentration as the second solid phase concentration.

Specifically, whether the voltage mean square error MSE is less than or equal to the voltage mean square error threshold is determined, if not, the positive electrode solid phase concentration is continuously corrected according to the gradient descent method formula in step S620 until the MSE is less than or equal to the voltage mean square error threshold.

According to embodiments of the method for correcting the solid phase concentration of the lithium battery of the invention, on the basis of determining whether the voltage difference between the initial detection value of the simulated output voltage and the initial detection value of the actual output voltage is not greater than the preset voltage threshold, the solid-phase concentration value of the lithium battery is corrected more accurately in an iterative manner by secondarily determining whether the voltage mean square error is greater than the preset voltage mean square error threshold. The iterative correction precision is controlled by adjusting the voltage difference threshold and the voltage mean square error threshold.

In one embodiment, the process of executing step S620 to perform iterative correction on the first solid phase concentration when the voltage difference is greater than the voltage difference threshold, until the voltage difference is not greater than the voltage difference threshold, and output the corrected first solid phase concentration as the third solid phase concentration, a first corresponding relation between the lithium battery electrode material ocp and the lithium ion concentration c, and a dc/docp value of the lithium battery are obtained in advance, where ocp is an open circuit potential of the electrode when the lithium ion concentration is c. Then, a second corresponding relation between dc/docp and ocp is obtained according to the first corresponding relation and the dc/docp value of the lithium battery. The iterative correction on the positive solid phase concentration in the first solid phase concentration is performed by the gradient descent method according to the second corresponding relation.

In one embodiment, the first corresponding relation between the lithium battery electrode material ocp and the lithium ion concentration c can be obtained by consulting the related data of the electrode materials.

Figure 6:
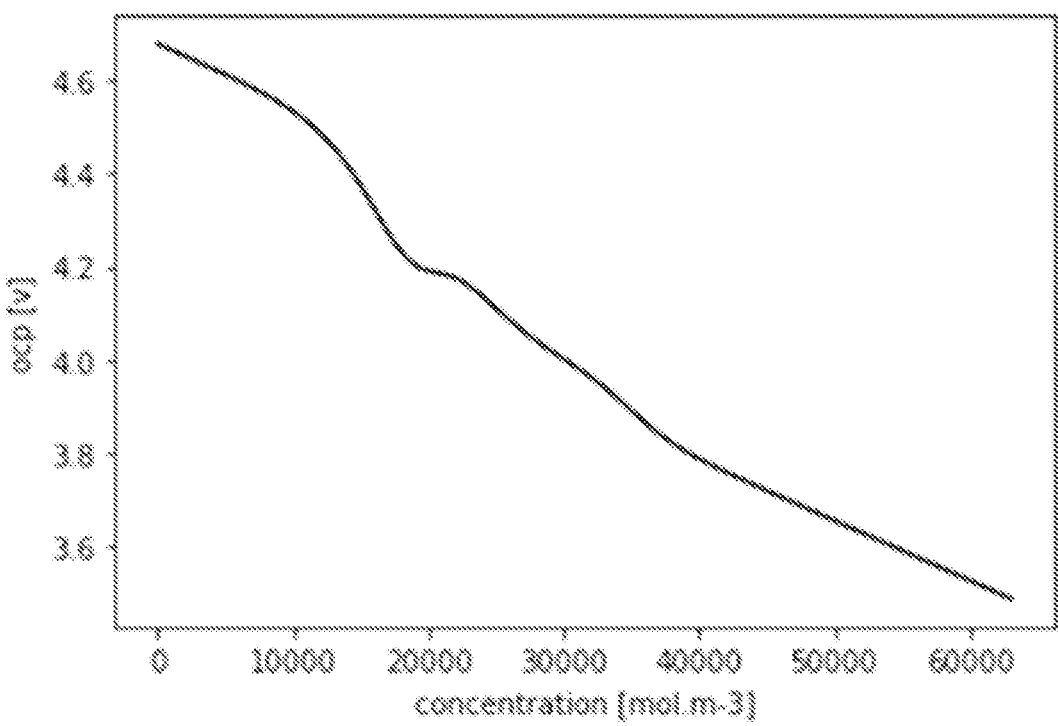
FIG. 6 shows schematically the relationship curve between the solid phase concentration and the positive electrode material ocp in the lithium battery according to one embodiment of the method for correcting the solid phase concentration of the lithium battery of the invention.
Figure 7:
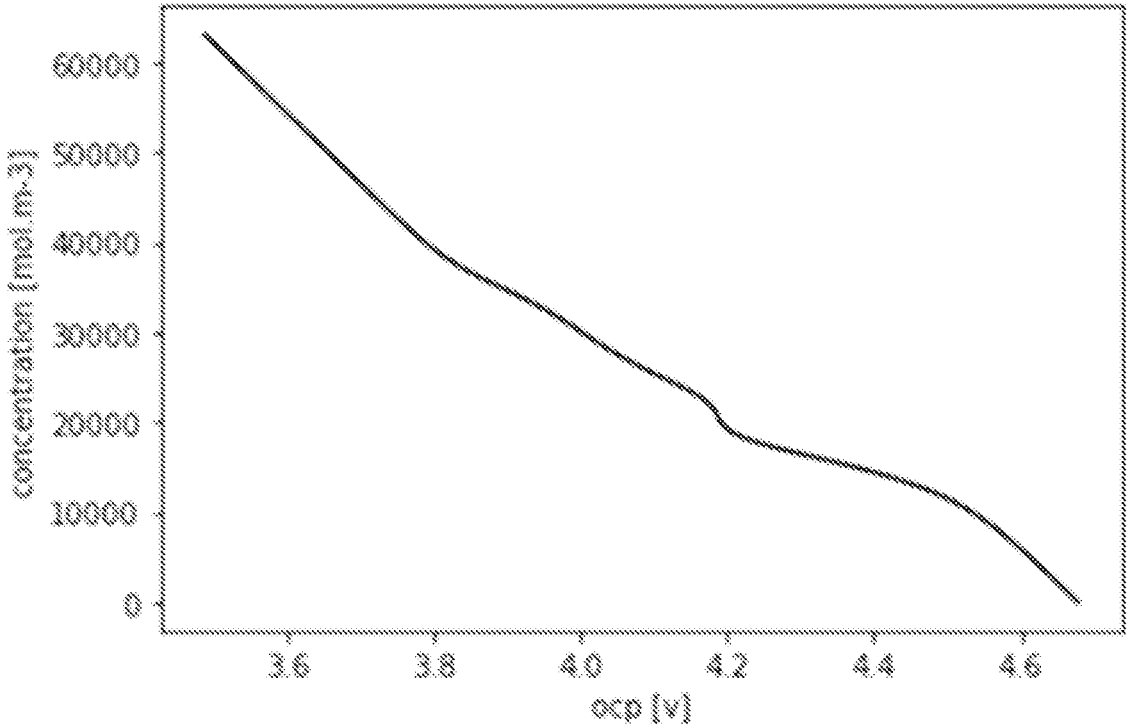
FIG. 7 shows schematically the relationship curve between the electrode material ocp and the solid phase concentration in the lithium battery according to one embodiment of the method for correcting the solid phase concentration of the lithium battery of the invention.
Figure 8:
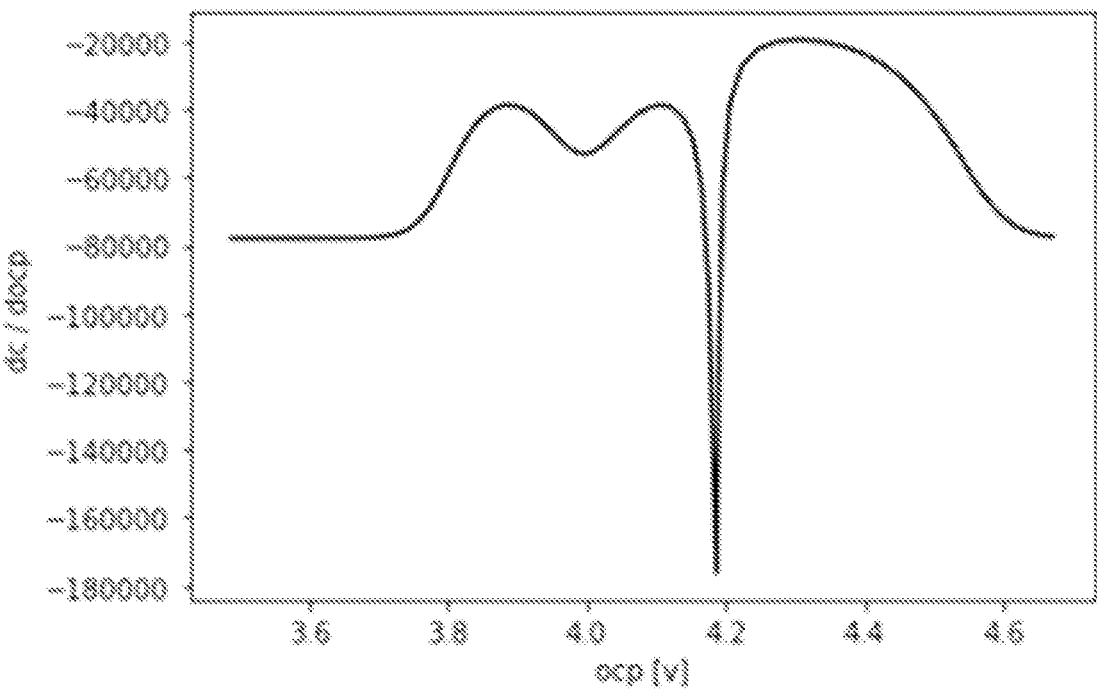
FIG. 8 shows schematically the relationship curve between dc/docp and ocp of the lithium battery electrode material according to one embodiment of the method for correcting the solid phase concentration of the lithium battery of the invention.

FIG. 6 is an exemplary diagram showing the relationship between the solid phase concentration and the positive electrode material ocp in the lithium battery. FIG. 7 is an exemplary diagram showing the relationship between the solid phase concentration and the lithium battery electrode material ocp. FIG. 8 is an exemplary diagram showing the relationship between dc/docp and the lithium battery electrode material ocp.

Figure 9:
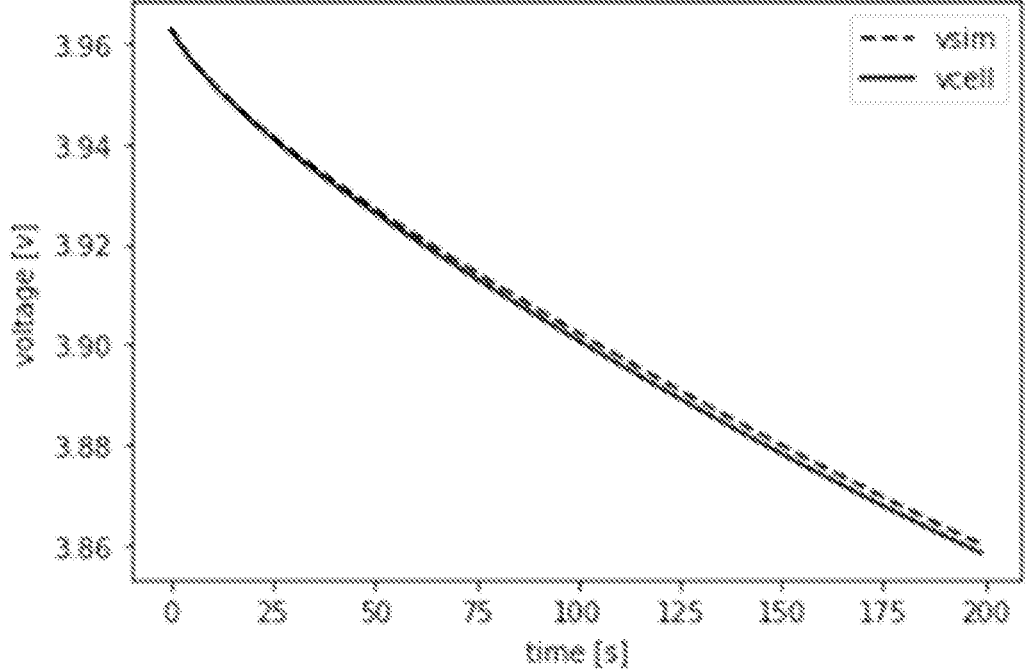
FIG. 9 shows schematically the simulated output voltage and the actual output voltage after correction according to one embodiment of the method for correcting the solid phase concentration of the lithium battery of the invention.
Figure 10:
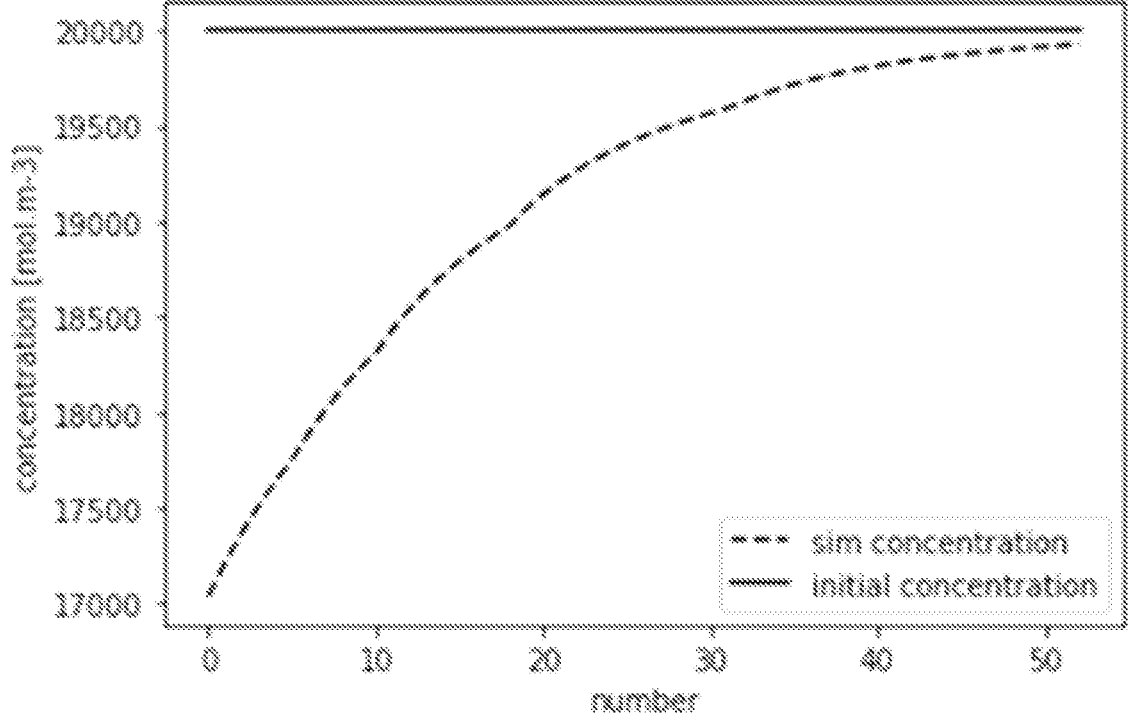
FIG. 10 shows schematically the trend of the solid phase concentration of the positive electrode in the process of correction according to one embodiment of the method for correcting the solid phase concentration of the lithium battery of the invention.

In one embodiment, in performing steps S510-S640, the positive electrode solid phase concentration is initialized to be $c_{p,100}$. In the iterative correction process, the correction coefficient lr is set to 0.1, the voltage difference threshold is set to 1 mV, and the voltage mean square error threshold is set to 2 $(mV)^2$. The results of the solid phase concentration correction of the lithium battery are shown in FIGS. 9-10. FIG. 9 shows the simulated output voltage and the actual output voltage after correction, where $V_{sim}$ dashed line represents the simulated output voltage, and $V_{cell}$ solid line represents the actual output voltage. FIG. 10 is a positive solid phase concentration change trend in the correction process, where FIG. 10 the sim concentration (dashed line) represents the initialized positive solid phase concentration correction change curve, and the initial concentration (solid line) represents the positive solid phase concentration actual curve. The error of correction of the positive solid phase concentration is less than 0.25% from experimental curve data analysis. It should be noted that the term "solid phase concentration correction of a lithium battery", used in the disclosure, refers to "solid phase lithium ion concentration correction of a lithium battery".

In one embodiment, in the process of step S400 acquiring the actual output voltage of the lithium battery in the preset period of time, the actual output voltage of the lithium battery within the preset period of time can be acquired at the preset intervals, or the actual output voltage of the lithium battery within the preset period of time can be acquired in real time. According to the method for the solid phase concentration correction of the lithium battery of the invention, by conducting charging and discharging experiments within a period of time at regular intervals, the solid phase concentration can be corrected according to the data of the charging and discharging experiments. Further, by collecting the charging and discharging data of the lithium battery in real time, the solid phase concentration can be corrected according to the collected charging and discharging data.

Figure 11:
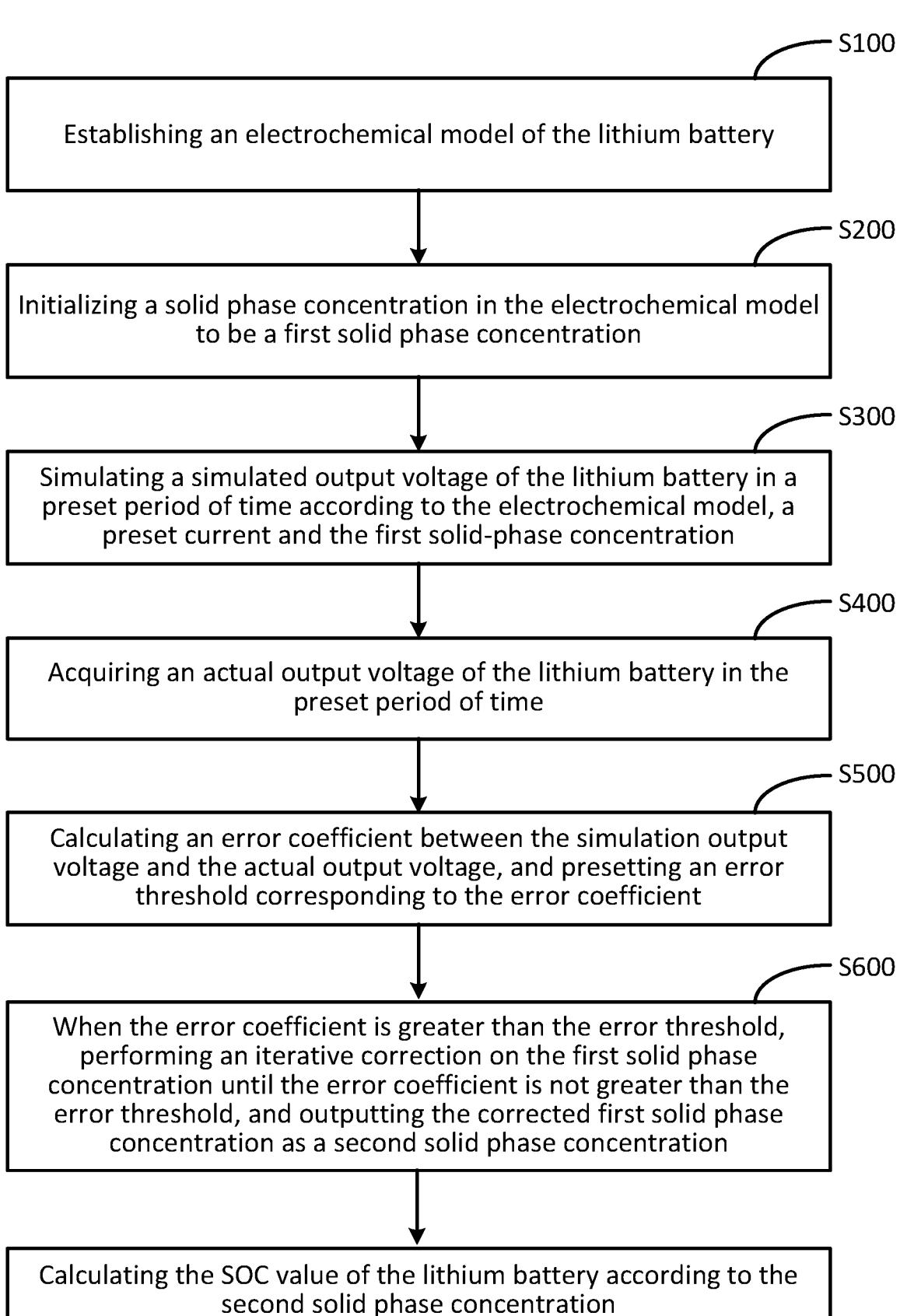
FIG. 11 shows schematically another flowchart of a method for correcting the solid phase concentration of a lithium battery according to embodiments of the invention.

In one embodiment, as shown in FIG. 11, the process of step S600, when the error coefficient is greater than the error threshold, performing iterative correction on the first solid phase concentration until the error coefficient is not greater than the error threshold, and after outputting the corrected second solid phase concentration, the method further includes step S700, calculating the SOC value of the lithium battery according to the second solid phase concentration.

Specifically, the current mainstream SOC estimation methods are based on macroscopic physical quantities such as current and voltage to estimate, and the more commonly used methods include the open circuit voltage method and the ampere-hour integration method. The ampere-hour integration method needs to integrate the charging or discharging current of the battery over a period of time, and add it to the initial charge capacity. The accuracy depends on the accuracy of the initial SOC. However, it is difficult to accurately obtain the initial SOC value of the battery under actual working conditions, so that the accuracy is reduced.

The open circuit voltage method is to measure the open circuit voltage (OCV) of the battery corresponding to each SOC value and establish a mapping relationship between the OCV and the SOC of the battery. However, when the open circuit voltage is measured, the battery needs to be disconnected from an external circuit and measured after a period of time, so that the open circuit voltage method is not suitable for online estimation.

At present, the battery SOC is estimated by using a Kalman filtering algorithm, a neural network method and other algorithms based on a battery model, but no complex electrochemical change process in the battery is involved.

According to embodiments of the lithium battery solid-phase concentration correction method of the invention, the SOC value of the lithium battery can be directly calculated according to the corrected solid-phase concentration. The SOC value calculated by the BMS and the measured current value can be input into then electrochemical model after the electrochemical model of the battery is established. The electrochemical model is corrected through comparing the errors between the model output voltage and the real-time voltage of the battery, the SOC of the battery is recalculated. The battery SOC value calculated by the BMS can be corrected in real time.

According to embodiments of the lithium battery solid-phase concentration correction method of the invention, the SOC value of the lithium battery can be calculated according to the corrected solid phase concentration value, and the accuracy of the calculation of the SOC value of the lithium battery can be improved, which can avoid errors in the calculation of the SOC value of the lithium battery in the prior art that affects the control of the battery pack.

Figure 12:
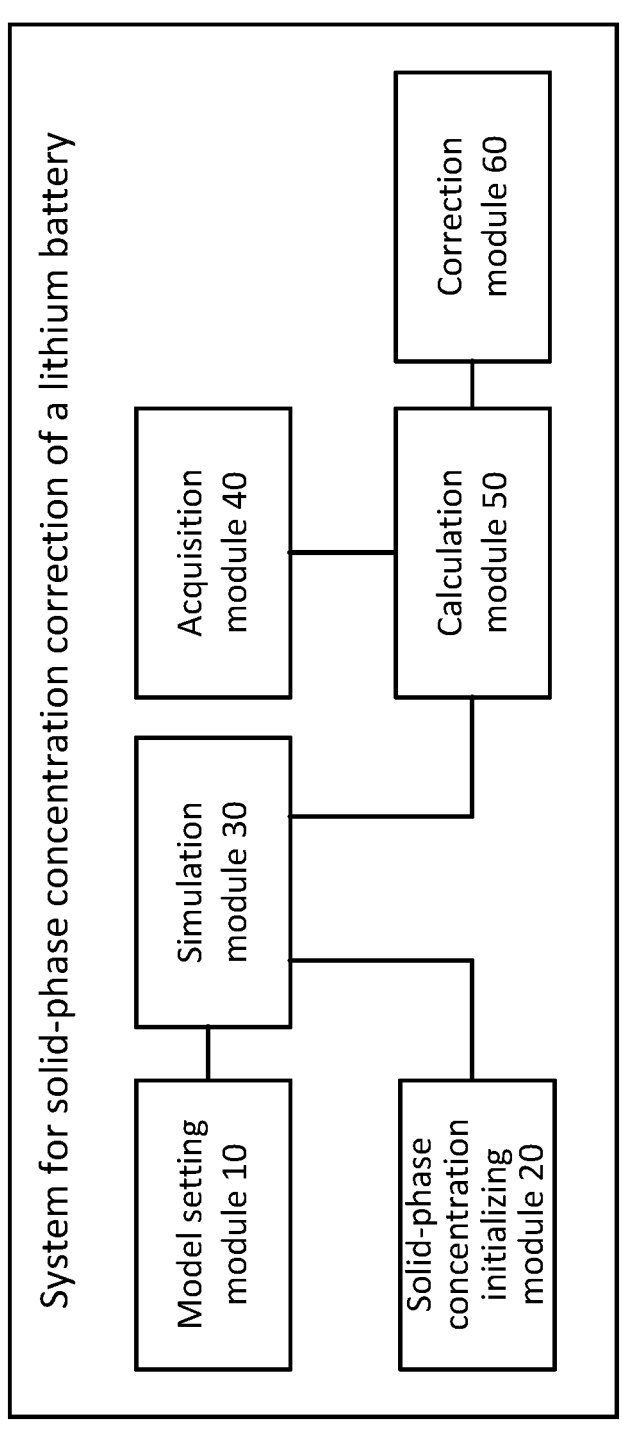
FIG. 12 shows schematically system for correcting the solid phase concentration of a lithium battery according to embodiments of the invention.

In one embodiment, as shown in FIGS. 2-3 and 12, the invention further provides a system for the solid-phase concentration correction of the lithium battery, which includes a model setting module 10, a solid-phase concentration initializing module 20, a simulation module 30, an acquisition module 40, a calculation module 50 and a correction module 60.

The model setting module 10 is configured to establish the electrochemical model of the lithium battery.

Specifically, according to the battery parameters and environmental parameters of the lithium battery used in the actual working condition, the electrochemical model of the lithium battery can be established. The common electrochemical model structures, such as the P2D electrochemical model, the electrothermal coupling electrochemical model, etc., can be selected. The terminal voltage and lithium ion concentration distribution of lithium battery under different working conditions can be calculated through the established electrochemical model.

As an example, FIG. 2 shows a schematic diagram of voltage versus operating time of the lithium battery based on the electrochemical simulation under a 1C condition, where 1C represents the current intensity when the battery is fully discharged for one hour.

The solid phase concentration initialization module 20 is configured to initialize a solid phase concentration in the electrochemical model to be a first solid phase concentration.

Specifically, in the process of initializing the solid phase concentration in the electrochemical model as the first solid phase concentration, the solid phase concentration can be set arbitrarily. When the state of charge of the battery is soc, the initial solid phase concentrations of the positive and negative electrodes satisfy the following formula:

$$\frac{c_{n,100} - c_{n,soc}}{c_{p,soc} - c_{p,100}} = \frac{L_p \varepsilon_p}{L_n \varepsilon_n};$$

wherein $c_{n,100}$ is a concentration of a negative electrode active material of the lithium battery at soc=100%, $c_{n,soc}$ is a concentration of the negative electrode active material of the lithium battery at soc, $L_n$ is a thickness of the negative electrode active material, $\varepsilon_n$ is a volume fraction of the negative electrode active material, and p represents a positive electrode active material of the lithium battery.

The simulation module 30 is respectively connected with the model setting module 10 and the solid-phase concentration initializing module 20, and is configured to simulate a simulated output voltage of the lithium battery in a preset period of time according to the electrochemical model, a preset current and the first solid-phase concentration.

Specifically, after the concentration is initialized, the preset current working condition is input into the electrochemical model, and the electrochemical model can simulate and output the simulated output voltage of the battery within a preset period of time.

The acquisition module 40 is configured to acquire an actual output voltage of the lithium battery in the preset period of time.

In one exemplary embodiment shown in FIG. 3, which shows the simulated output voltage and the actual output voltage when the positive electrode solid phase concentration is $c_{p,100}$ under the condition of 1C constant current discharge of the lithium battery simulated by the electrochemical model, where $V_{sim}$ dashed line indicates the simulated output voltage curve, and $V_{cell}$ solid curve represents the actual output voltage curve.

The calculation module 50 is connected to the simulating module 30 and the acquisition module 40, and is configured to calculate an error coefficient between the simulation output voltage and the actual output voltage, and preset an error threshold corresponding to the error coefficient, wherein the error coefficient comprises a voltage difference and a voltage mean square error of an initial detection value.

Specifically, the error coefficient comprises a voltage difference and a voltage mean square error of an initial detection value. In the process of simulating the simulated output voltage of the lithium battery within the preset period of time and obtaining the actual output voltage of the lithium battery within the preset period of time, multiple sampling points are included, and $|V_{sim,1} - V_{real,1}|$ is set as the voltage difference of the initial detection value. $V_{sim,i}$ is the first voltage value output by the model simulation, and $V_{real,1}$ is the first voltage value of the battery measured under the working condition.

The voltage mean square error MSE is calculated according to the formula of:

$$MSE = \frac{1}{N} \sum_{i=1}^{N} (V_{sim,i} - V_{real,i})^2,$$

wherein $V_{sim,i}$ is an output voltage value of the model simulation at the ith sampling point, $V_{real,1}$ is the measured voltage value of the battery under the working condition of the ith sampling point, and N is the number of voltage data.

The correction module 60 is connected to the calculation module 50, and is configured to, when the error coefficient is greater than the error threshold, perform an iterative correction on the first solid phase concentration until the error coefficient is not greater than the error threshold, and output the corrected first solid phase concentration as a second solid phase concentration.

According to embodiments of the method for correcting the solid phase concentration of a lithium battery of the invention, the iterative correction on the preset first solid phase concentration is performed by comparing the difference between the simulated output voltage of the electrochemical model and the actual output voltage of the lithium battery under preset working conditions, so as to obtain the accurate solid phase concentration value of the lithium battery, and the working condition parameters of the lithium battery can be conveniently and accurately obtained based on the solid-phase concentration.

In another aspect, the invention further provides a non-transitory tangible computer-readable medium storing at least one instruction which, when executed by one or more processors, causes the above system to perform the method for correcting the solid-phase concentration of the lithium battery. For example, the storage medium may be read-only memory (ROM), random-access memory (RAM), compact disk read-only (CD-ROM), magnetic tape, floppy disk, optical data storage device, etc.

They may be implemented in program codes that are executable by a computing device such that they may be stored in a memory device for execution by the computing device, or they may be separately fabricated into individual integrated circuit modules, or a plurality of modules or steps in them may be fabricated into a single integrated circuit module. Thus, the invention is not limited to any specific combination of hardware and software.

In the foregoing embodiments, the descriptions of the embodiments are focused on, and the parts of a certain embodiment that are not described or depicted in detail may be referred to in the related descriptions of other embodiments.

Those of ordinary skill in the art will appreciate that the elements and steps of the examples described in connection with the embodiments disclosed herein can be implemented as electronic hardware, or as a combination of computer software and electronic hardware. Whether such functionality is implemented as hardware or software depends upon the particular application and design constraints imposed on the solution. Skilled artisans may implement the described functionality in varying ways for each particular application, but such implementation decisions should not be interpreted as causing a departure from the scope of the invention.

In the embodiments provided in the invention, it should be understood that the disclosed method, system and storage medium for correcting solid-phase concentration of lithium battery may be implemented in other manners. For example, the above-described embodiments of a method, a system, and a storage medium for correcting solid-phase concentration of a lithium battery are merely illustrative, for example, the division of the modules or units is merely a logic function division, and other division manners may be implemented in practice, for example, multiple units or modules may be combined or integrated into another system, or some features may be omitted, or not performed. Alternatively, the communications links shown or discussed may be through some interface, device or unit communications link or integrated circuit, whether electrical, mechanical or otherwise.

The units described as separate units may or may not be physically separate, and units shown as units may or may not be physical units, may be located in one place, or may be distributed on a plurality of network units. Some or all of the units may be selected according to actual needs to achieve the purpose of the solution of this embodiment.

In addition, each functional unit in the embodiments of the invention may be integrated in one processing unit, or each unit may exist alone physically, or two or more units may be integrated in one unit. The integrated units may be implemented in hardware or in software functional units.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

What is claimed is:

1. A method for solid phase concentration correction of a lithium battery, comprising:
   establishing an electrochemical model of the lithium battery;

16 initializing a solid phase concentration in the electrochemical model to be a first solid phase concentration;
   simulating a simulated output voltage of the lithium battery in a preset period of time according to the electrochemical model, a preset current and the first solid-phase concentration;
   acquiring an actual output voltage of the lithium battery in the preset period of time;
   calculating an error coefficient between the simulation output voltage and the actual output voltage, and presetting an error threshold corresponding to the error coefficient, wherein the error coefficient comprises a voltage difference and a voltage mean square error of an initial detection value; and
   when the error coefficient is greater than the error threshold, performing an iterative correction on the first solid phase concentration until the error coefficient is not greater than the error threshold, and outputting the corrected first solid phase concentration as a second solid phase concentration, wherein the iterative correction of the first solid phase concentration comprises:
   iteratively correcting a positive electrode solid phase concentration in the first solid phase concentration using a gradient descent method, according to a formula of:

$$c = c - lr \times \Delta V \times \frac{dc}{docp}$$

wherein c is the positive electrode solid phase concentration in the first solid phase concentration, lr is the correction coefficient, $\Delta V$ is the voltage difference, ocp is an open circuit potential of the electrode when the solid phase concentration of the positive electrode is c; and
   correcting a negative electrode solid-phase concentration in the first solid-phase concentration according to the corrected positive electrode solid-phase concentration, according to a formula of:

$$\frac{c_{n,100} - c_{n,soc}}{c_{p,soc} - c_{p,100}} = \frac{L_p \varepsilon_p}{L_n \varepsilon_n};$$

wherein $c_{n,100}$ is a concentration of a negative electrode active material of the lithium battery at soc=100%, $c_{n,soc}$ is a concentration of the negative electrode active material of the lithium battery at soc, $L_n$ is a thickness of the negative electrode active material, $\varepsilon_n$ is a volume fraction of the negative electrode active material, and p represents a positive electrode active material of the lithium battery.

2. The method of claim 1, wherein said calculating the error coefficient between the simulated output voltage and the actual output voltage and said presetting the error threshold corresponding to the error coefficient comprises:
   calculating the voltage difference between the initial detection value of the simulation output voltage and the initial detection value of the actual output voltage, and presetting the voltage difference threshold.

3. The method of claim 2, wherein said calculating the error coefficient between the simulated output voltage and the actual output voltage and said presetting the error threshold corresponding to the error coefficient further comprises:

17 calculating the voltage mean square error of the simulation output voltage and the actual output voltage, and presetting a voltage mean square error threshold, wherein, when the error coefficient is greater than the error threshold, said performing the iterative correction on the first solid phase concentration until the error coefficient is not greater than the error threshold, and said outputting the corrected first solid phase concentration as the second solid phase concentration, comprises:

determining whether the voltage difference is greater than the voltage difference threshold;

when the voltage difference is greater than the voltage difference threshold, iteratively correcting the first solid phase concentration until the voltage difference is not greater than the voltage difference threshold, and outputting the corrected first solid phase concentration as a third solid phase concentration;

determining whether the voltage mean square error is greater than the voltage mean square error threshold; and when the voltage mean square error is greater than the voltage mean square error threshold, iteratively correcting the third solid phase concentration until the voltage mean square error is not greater than the voltage mean square error threshold, and outputting the corrected third solid phase concentration as the second solid phase concentration.

4. The method of claim 1, wherein prior to said iteratively correcting the positive electrode solid phase concentration in the first solid phase concentration using the gradient descent method, the method further comprises:

acquiring a first corresponding relation between a lithium battery electrode material ocp, an lithium ion concentration c, and a dc/docp value of the lithium battery, wherein ocp is the open-circuit potential of the electrode when its lithium ion concentration is c; and obtaining a second corresponding relation of dc/docp and ocp according to the first corresponding relation and the dc/docp value of the lithium battery.

5. The method of claim 1, wherein said acquiring the actual output voltage of the lithium battery in the preset period of time comprises:

acquiring the actual output voltage of the lithium battery in the preset period of time at preset intervals.

6. The method of claim 1, wherein said acquiring the actual output voltage of the lithium battery in the preset period of time further comprises:

acquiring the actual output voltage of the lithium battery in the preset period of time in real time.

7. The method of claim 1, wherein after outputting the second solid phase concentration, further comprising:

calculating a SOC value of the lithium battery according to the second solid phase concentration.

8. A non-transitory tangible computer-readable medium storing at least one instruction which, when executed by one or more processors, causes a system to perform the method for solid phase concentration correction of a lithium battery according to claim 1.

9. A system for solid phase concentration correction of a lithium battery, comprising:

a model setting module configured to establish an electrochemical model of the lithium battery;

a solid phase concentration initializing module configured to initialize a solid phase concentration in the electrochemical model to be a first solid phase concentration;

a simulation module respectively connected with the model setting module and the solid-phase concentration initializing module, and configured to simulate a simulated output voltage of the lithium battery in a preset period of time according to the electrochemical model, a preset current and the first solid-phase concentration;

an acquisition module configured to acquire an actual output voltage of the lithium battery in the preset period of time;

a calculation module respectively connected with the simulation module and the acquisition module and configured to calculate an error coefficient between the simulation output voltage and the actual output voltage, and preset an error threshold corresponding to the error coefficient, wherein the error coefficient comprises a voltage difference and a voltage mean square error of an initial detection value; and a correction module connected with the calculation module and configured to, when the error coefficient is greater than the error threshold, perform an iterative correction on the first solid phase concentration until the error coefficient is not greater than the error threshold, and output the corrected first solid phase concentration as a second solid phase concentration, wherein the iterative correction of the first solid phase concentration comprises:

iteratively correcting a positive electrode solid phase concentration in the first solid phase concentration using a gradient descent method, according to a formula of:

$$c = c - lr \times \Delta V \times \frac{dc}{docp}$$

wherein c is the positive electrode solid phase concentration in the first solid phase concentration, lr is the correction coefficient, $\Delta V$ is the voltage difference, ocp is an open circuit potential of the electrode when the solid phase concentration of the positive electrode is c; and correcting a negative electrode solid-phase concentration in the first solid-phase concentration according to the corrected positive electrode solid-phase concentration, according to a formula of:

$$\frac{c_{n,100} - c_{n,soc}}{c_{p,soc} - c_{p,100}} = \frac{L_p \varepsilon_p}{L_n \varepsilon_n};$$

wherein $c_{n,100}$ is a concentration of a negative electrode active material of the lithium battery at soc=100%, $c_{n,soc}$ is a concentration of the negative electrode active material of the lithium battery at soc, $L_n$ is a thickness of the negative electrode active material, $\varepsilon_n$ is a volume fraction of the negative electrode active material, and p represents a positive electrode active material of the lithium battery.

\* \* \* \* \*